(12) United States Patent
Liu

(10) Patent No.: US 10,012,676 B2
(45) Date of Patent: Jul. 3, 2018

(54) PROBE CARD AND TESTING METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventor: Chang-Ming Liu, Hsinchu County (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 206 days.

(21) Appl. No.: 15/137,006

(22) Filed: Apr. 25, 2016

(65) Prior Publication Data

US 2017/0108535 A1    Apr. 20, 2017

(30) Foreign Application Priority Data

Oct. 20, 2015    (CN) .......................... 2015 1 0682725

(51) Int. Cl.
*G01R 31/00*   (2006.01)
*G01R 1/073*   (2006.01)
*G01R 31/28*   (2006.01)

(52) U.S. Cl.
CPC ..... *G01R 1/07371* (2013.01); *G01R 31/2887* (2013.01); *G01R 31/2889* (2013.01)

(58) Field of Classification Search
CPC .............. G01R 1/0466; G01R 1/06705; G01R 1/06794; G01R 1/07314; G01R 1/07364; G01R 31/01; G01R 31/028; G01R 31/2863; G01R 31/2889; G01R 31/2891; G01R 1/07307; G01R 1/07342
See application file for complete search history.

(56) References Cited

U.S. PATENT DOCUMENTS

| 7,177,378 | B2 | 2/2007 | Baldemair et al. |
| 7,282,933 | B2 | 10/2007 | Henson et al. |
| 2005/0253607 | A1* | 11/2005 | Kimoto .............. G01R 1/07314 324/754.01 |
| 2006/0290367 | A1* | 12/2006 | Hobbs ................ G01R 31/2886 324/750.22 |
| 2008/0164898 | A1* | 7/2008 | Bae .................... G01R 1/07385 324/762.06 |
| 2012/0155530 | A1 | 6/2012 | Zhong |
| 2014/0258951 | A1 | 9/2014 | Danti et al. |

FOREIGN PATENT DOCUMENTS

| CN | 101644732 A | 2/2010 |
| CN | 102998497 A | 3/2013 |

* cited by examiner

*Primary Examiner* — Tung X Nguyen
(74) *Attorney, Agent, or Firm* — CKC & Partners Co., Ltd.

(57) ABSTRACT

A probe card and a testing method are disclosed herein. The probe card includes a plurality of probe sets arranged as a testing unit. The testing unit is configured to test a plurality of dies in a test region on a wafer, and to move m unit along a first direction and n unit along a second direction when the test complete so as to test the next test region, in which m and n are integers.

19 Claims, 9 Drawing Sheets

PROBE CARD AND TESTING METHOD

RELATED APPLICATIONS

This application claims priority to China Application Serial Number 201510682725.8, filed Oct. 20, 2015, which is herein incorporated by reference.

BACKGROUND

Technical Field

The present disclosure relates to a probe card, and in particular, to a probe card for multi-die testing.

Description of Related Art

In recent times, with the development of the semiconductor manufacture technology, wafer probe testing is widely applied in the testing procedures before packaging to lower the package cost cause by the failed dies. However, as the progress of the manufacturing technology, the size of the chip is reduced and the pin numbers are increased, multi-site testing is an essential methodology for test cost reduction. However, some kind of traditionally multi-site probe cards are restricted by either layout or probing steps and then not suitable of the wafer probe testing.

Therefore, an important area of research in the field involves ways in which to improve the probe card to increase the testing efficiency of the wafer probe testing and apply the probe card in testing procedures systematically.

SUMMARY

To solve the problem stated above, one aspect of the present disclosure is a probe card. The probe card includes a plurality of probe sets arranged as a testing unit. The testing unit is configured to test a plurality of dies in a test region on a wafer, and to move m unit along a first direction and n unit along a second direction when the test complete so as to test the next test region, in which m and n are integers.

Another aspect of the present disclosure is a testing method. The testing method includes testing, by a plurality of probe sets arranged as a testing unit, a plurality of dies in a test region on a wafer, and moving the testing unit for m unit along a first direction and n unit along a second direction when the dies in the test region are tested, so as to test a next test region, in which m and n are integers.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
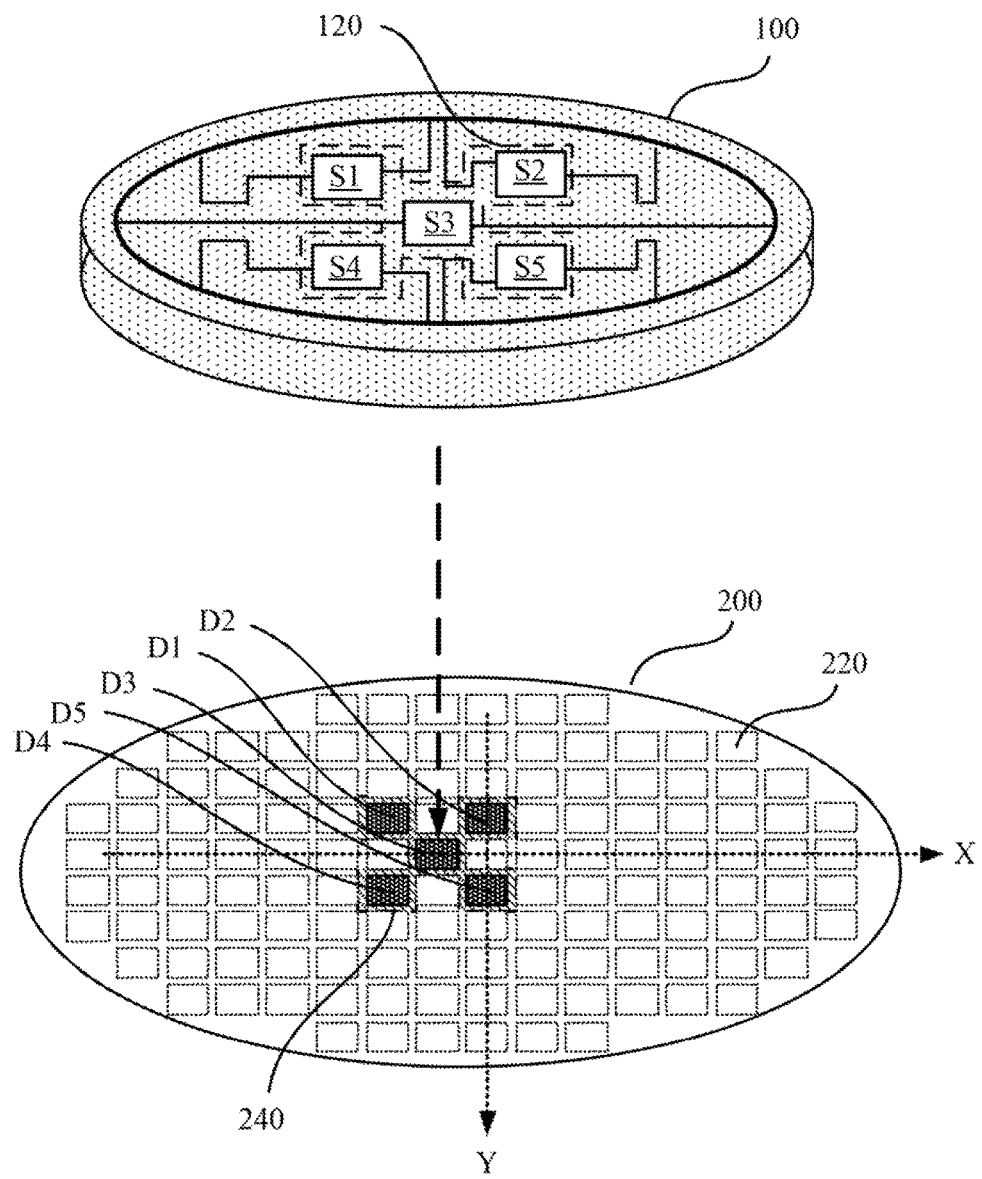
FIG. 1 is a diagram illustrating a probe card according to an embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a diagram illustrating a probe card 100 according to an embodiment of the present disclosure. As illustratively shown in FIG. 1, the probe card 100 includes a plurality of probe sets S1~S5 arranged as a testing unit 120. In some embodiments, the probe sets S1~S5 includes multiple probes respectively, and the number and the arrangement of the probes match the number and the arrangement of the test points of the dies 220 on the wafer 200. Thus, the testing unit 120 may be configured to test the wafer 200 having multiple dies 220. In a single test, the testing unit may test multiple dies 220 at the same time. Specifically, the probe sets S1~S5 may test multiple dies D1~D5 on the wafer 200 respectively.

In some embodiments, the testing unit 120 is configured to test a test region 240 on the wafer 200, in which the test region 240 includes a plurality of dies 220 to be tested. When the dies 220 in the test region 240 are tested by the testing unit 120, the probe card 100 and the testing unit 120 on which move relative to the wafer 200 with m units along a first direction, and with n units along a second direction, so as to test another test region, in which m and n are integer. In the present embodiment, the testing unit 120 is configured to repeat the movement mentioned above and test the dies sequentially.

In some embodiments, the first direction may be the x-axis direction (i.e., the probe card 100 move left and right relative to the wafer 200), and the second direction may be the y-axis direction (i.e., the probe card 100 move up and down relative to the wafer 200), but the present disclosure is not limited thereto. For example, in some other embodiments, the first direction may be the y-axis direction and the second direction may be the x-axis direction.

For better understanding, the specific operations and testing method of the probe card 100 will be explained in accordance with the figures in the following paragraphs.

Figure 2A:
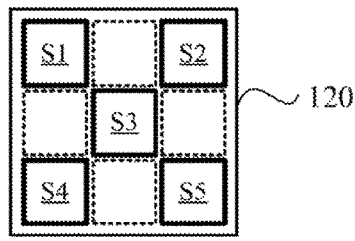
FIG. 2A is a diagram illustrating the testing unit according to an embodiment of the present disclosure.

Reference is made to FIG. 2A. FIG. 2A is a diagram illustrating the testing unit 120 according to an embodiment of the present disclosure. As illustratively shown in FIG. 2A, in the present embodiment, the testing unit 120 includes probe sets S1~S5. The probe sets S1 and S2, and the probe sets S4 and S5 are arranged in the odd rows and odd columns of the testing unit 120, and the probe set S3 is arranged in the even row and the even column of the testing unit 120, such that the probe sets S1~S5 form a substantially X-shape.

Figure 2B:
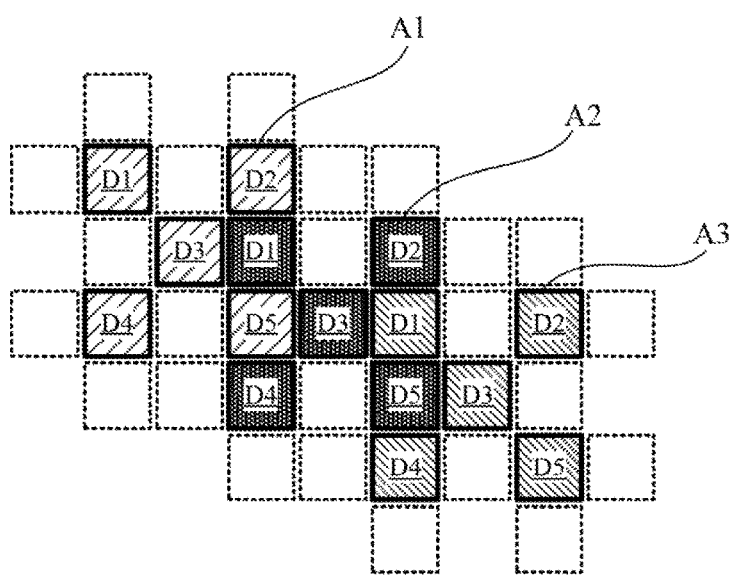
FIG. 2B and FIG. 2C are the diagrams illustrating the testing steps of the testing unit shown in FIG. 2A according to an embodiment of the present disclosure.
Figure 2C:
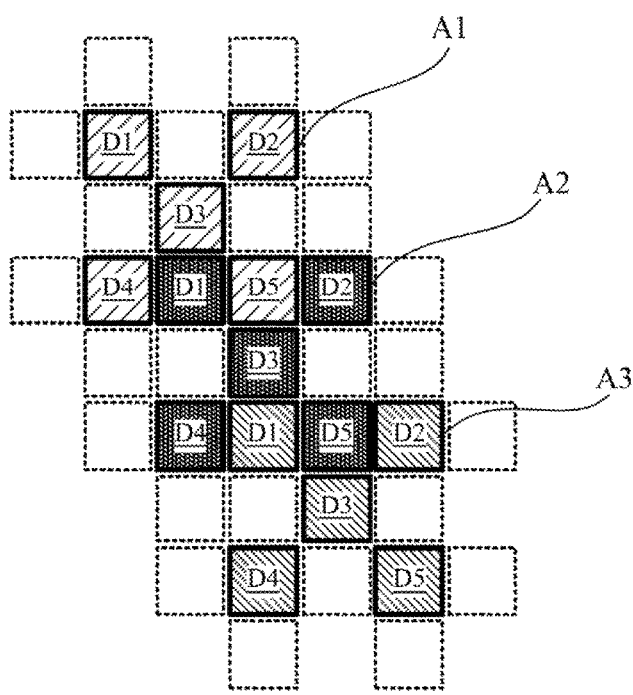

Reference is made in accompany with FIG. 2B and FIG. 2C. FIG. 2B and FIG. 2C are the diagrams illustrating the testing steps of the testing unit 120 shown in FIG. 2A. In the embodiment shown in FIG. 2B, the test region A1 on the wafer 200 includes five to-be-tested dies D1~D5 arranged in a substantially X-shape, in which the relative locations of which match the testing unit 120. Alternatively stated, when a test is performed by the probe card 100, the testing unit 120 completes the test of the to-be-tested dies D1~D5 in the test region A1.

Next, the testing unit 120 moves 2 units along the first direction (e.g., right) and 1 units along the second direction (e.g., down) so as to perform the test of the to-be-tested dies D1~D5 in the next test region A2. Next, repeating the moving mentioned above, the test of the to-be-tested dies D1~D5 in the next test region A3 may be performed, until the test completed.

Similarly, in the embodiments shown in FIG. 2C, the testing unit 120 moves 1 units along the first direction (e.g., right) and 2 units along the second direction (e.g., down) so as to perform the test of the to-be-tested dies D1~D5 in the next test region A2. Next, repeating the moving mentioned above, the testing unit 120 moves 1 units along the first direction (e.g., right) and 2 units along the second direction (e.g., down) so as to perform the test of the to-be-tested dies D1~D5 in the next test region A3. By repeating the above operation, the testing unit 120 may perform the test sequentially to multiple test regions along a specific direction until all the tests are completed. Since the to-be-tested dies in each test region A1~A3 are arranged in a staggered manner, the testing unit 120 may avoid repeatedly testing the same to-be-tested die, and thus the overall testing efficiency may be enhanced.

In some embodiments, the moving distance of the testing unit 120 is determined by the arrangement of the probe sets S1~S5 on the probe card 100. Specifically, if the adjacent probe set on the same row spaced x unit from each other and the adjacent probe set on the same column spaced y unit from each other, the moving distance of the testing unit 120 may be x unit along the first direction and y/2 unit along the second direction. In addition, the moving distance of the testing unit 120 may also be x/2 unit along the first direction and y unit along the second direction.

Alternatively stated, when the moving distance of the testing unit 120 may is m unit along the first direction and n unit along the second direction, the adjacent probe set on the same row spaced m unit from each other and the adjacent probe set on the same column spaced 2n unit from each other, or the adjacent probe set on the same row spaced 2m unit from each other and the adjacent probe set on the same column spaced n unit from each other.

For the embodiments shown in the FIG. 2A~FIG. 2C, the probe set S1 and S2 are arranged in the same row, in which the probe set S1 is in the first column and the probe set S2 is in the third column, and the probe sets S1 and S2 space 2 units to each other. The probe set S1 and S4 are arranged in the same column, in which the probe set S1 is in the first row and the probe set 84 is in the third row, and the probe sets S1 and S4 also space 2 units to each other. Therefore, there are two alternatives (2, 1) and (1, 2) for the moving distance (m, n) of the testing unit 120. In FIG. 2B, the embodiment of the testing unit 120 moving 2 units along the first direction and 1 unit along the second direction is illustratively shown. In FIG. 2C, the embodiment of the testing unit 120 moving 1 unit along the first direction and 2 units along the second direction is illustratively shown.

Thus, the probe card 100 may systematically test the dies 220 on the wafer 200 sequentially. Since multiple probe sets S1~S5 are included in the testing unit 120, multiple dies D1~D5 may be tested synchronously in one single test to shorten the testing time. In addition, since the probe sets S1~S5 are arranged to be horizontally and vertically symmetrical as a substantially X-shape, the probe sets S1~S5 may perform the testing in coordinate with the shape of the wafer 200 in order to lower the testing times needed when testing the dies 220 adjacent to the boundary of the wafer 200 and lower the cost of the testing.

It is noted that for one skilled in the art, the direction and the sequential order of the first direction and the second direction may be chosen according to the practical needs. For example, in some embodiments, the testing unit 120 may also move 2 units up and then 1 unit left. Various combinations are possible and are omitted herein for the sake of the brevity.

Figure 3:
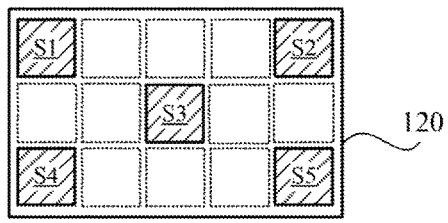
FIG. 3 is a diagram illustrating the testing unit according to another embodiment of the present disclosure.
Figure 4A:
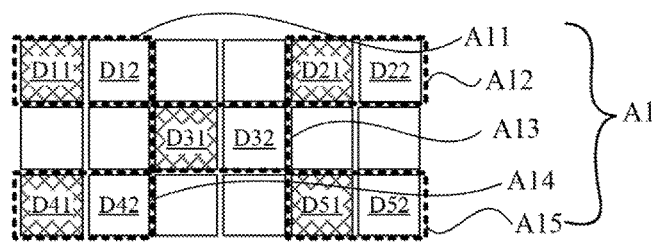
FIG. 4A~4D are the diagrams illustrating the testing steps of the testing unit shown in FIG. 3 according to an embodiment of the present disclosure.
Figure 4B:
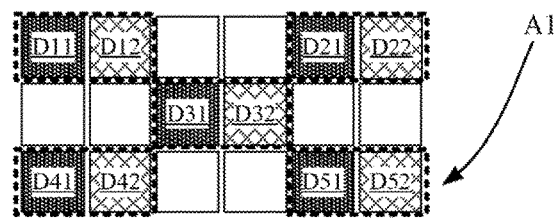
Figure 4C:
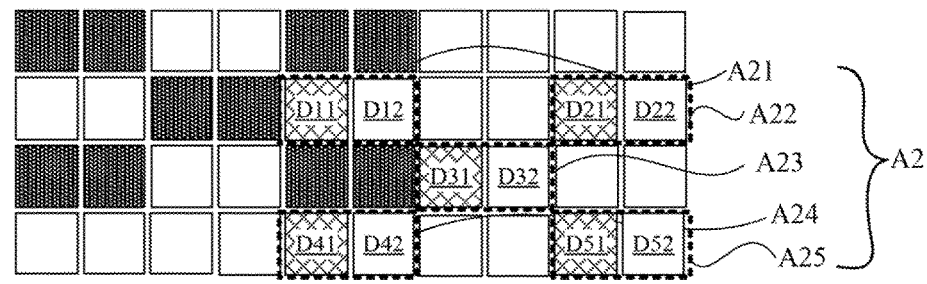
Figure 4D:
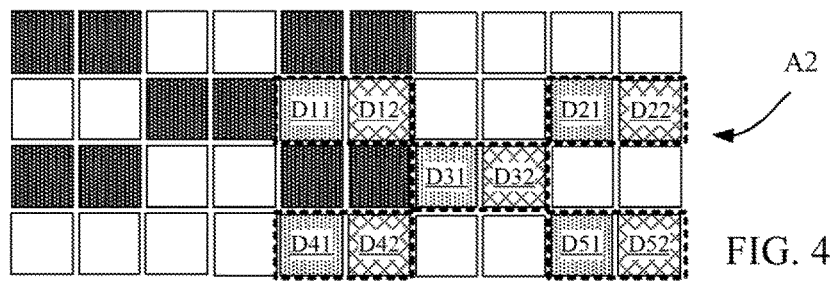
Figure 5A:
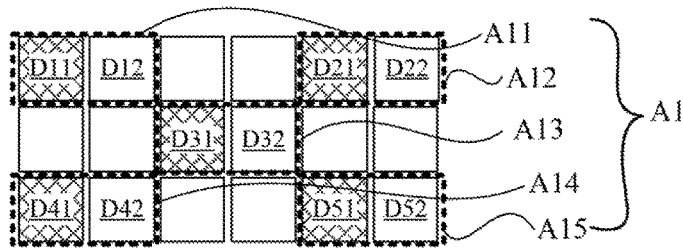
FIG. 5A~5D are the diagrams illustrating the testing steps of the testing shown in FIG. 3 according to another embodiment of the present disclosure.
Figure 5B:
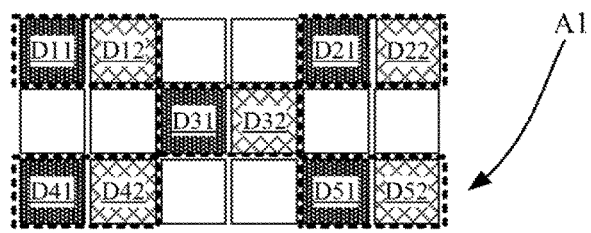
Figure 5C:
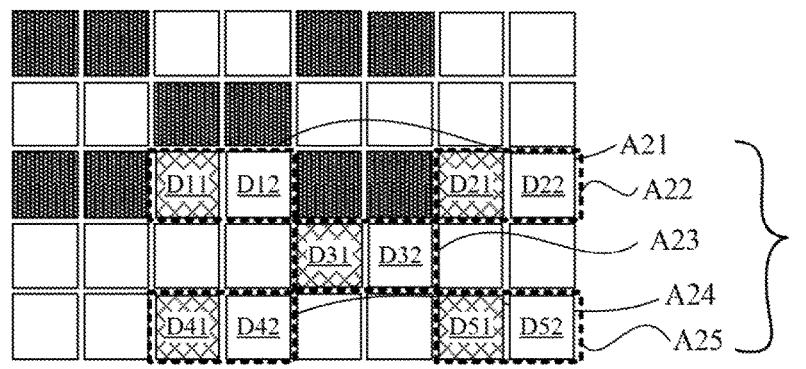
Figure 5D:
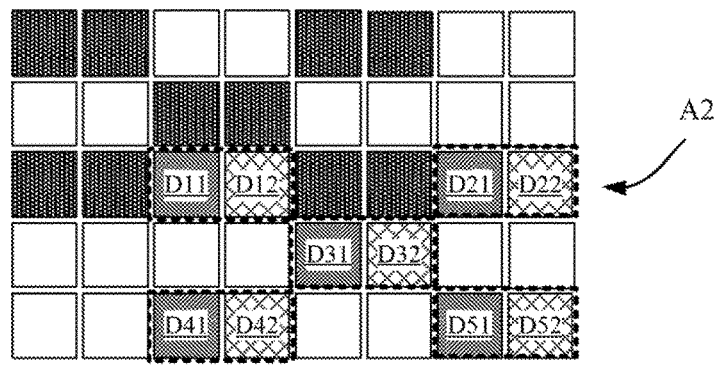

Reference is made to FIG. 3. FIG. 3 is a diagram illustrating the testing unit 120 according to another embodiment of the present disclosure. As illustratively shown in FIG. 3, in the present disclosure various arrangement may be applied to the probe sets S1~S5. In the present embodiment, the probe sets S1~S2 and S4~S5 are the first probe set, and the probe set S3 is the second probe set. The first probe sets and the second probe set are arranged in a plurality of rows and a plurality of columns in a staggered manner, in which the second probe is arranged in the rows and columns equidistantly to the adjacent first probe sets.

Reference is made in accompany with FIG. 4A~4D. FIG. 4A~4D are the diagrams illustrating the testing steps of the testing unit 120 shown in FIG. 3. In the embodiment shown in FIG. 4A~4D, the test region A1 on the wafer 200 includes five rectangular areas A11~A15. Compared to the embodiments shown in FIG. 2A~2C, each of the rectangular areas A11~A15 includes 2 to-be-tested dies. For example, the rectangular areas A11 includes to-be-tested dies D11 and D12, and the rectangular areas A12 includes to-be-tested dies D21 and D22 and so on.

The rectangular areas A1~A15 arranged in a substantially X-shape, in which the relative locations of the to-be-tested dies D11~D51 match the testing unit 120, and the relative locations of the to-be-tested dies D12~D52 match the testing unit 120. Alternatively stated, as illustratively shown in FIG. 4A, when a test is performed by the probe card 100, the testing unit 120 completes the test of the to-be-tested dies D11~D51 in the test region A1. Next, as illustratively shown in FIG. 4B, the testing unit 120 performs testing along the first direction to test the to-be-tested dies D12~D52 in the test region A1. Thus, the testing unit 120 completes the test of all the to-be-tested dies D11~D52 in the test region A1.

Next, the testing unit 120 moves m unit along the first direction and n unit along the second direction, so as to test another test region A2. Similarly, in the present embodiment, when testing the to-be-tested dies D11~D52 in the rectangular areas A21~A25 of the test region A2, the testing unit 120 performs testing along the first direction sequentially to test all the to-be-tested dies D11~D52.

In the embodiment shown in FIG. 3, the adjacent first probe sets (e.g., probe sets S1 and S2) arranged in the same row are in the first column and the fifth column, which space 4 units to each other. The adjacent first probe sets (e.g., probe sets S1 and S4) arranged in the same column are in the first row and the third row, which space 2 units to each other. Thus, two alternatives (4, 1) or (2, 2) may be chosen for the moving distance (m, n) of the testing unit 120.

Thus, in the testing steps illustratively shown in FIG. 4A~FIG. 4D, when the testing unit 120 moves from the test region A1 to the test region A2, the testing unit 120 moves along the first direction (e.g., right) for 4 units and along the second direction (e.g., down) for 1 unit in sum.

Reference is made in accompany with FIG. 5A~FIG. 5D. FIG. 5A~5D are the diagrams illustrating the testing steps of the testing unit 120 shown in FIG. 3 according to another embodiment of the present disclosure. In the present embodiment, similar to the embodiment shown in FIG. 4A~4D, the testing unit 120 performs testing along the first direction to test the to-be-tested dies D11~D52 in the test region A1 to completes the test of all the to-be-tested dies D11~D52 in the test region A1. But in the present disclosure, the testing unit 120 moves along the first direction (e.g., right) for 2 units and along the second direction (e.g., down) for 2 unit in sum when moving from the test region A1 to the test region A2.

It is noted the though 2*1 to-be-tested dies are included in the rectangular areas A11~A15 respectively in the embodiments shown in the FIG. 3, FIG. 4A~4D and FIG. 5A~5D, it is merely for the exemplary purposes and better understanding. For example, the rectangular area A11~A15 may also include 3*1 or 4*1 to-be-tested dies and the testing unit 120 moves 2 or 3 units along the first direction sequentially to complete the test of all the dies in the test region A1. Similarly, the rectangular area A11~A15 may also include 1*2, 1*3 or 1*4 to-be-tested dies and the testing unit 120 moves 1, 2 or 3 units up or down sequentially to complete the test of all the dies in the test region A1.

Figure 6A:
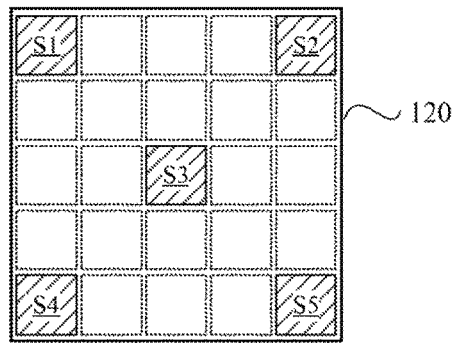
FIG. 6A is a diagram illustrating the testing unit according to another embodiment of the present disclosure.
Figure 6B:
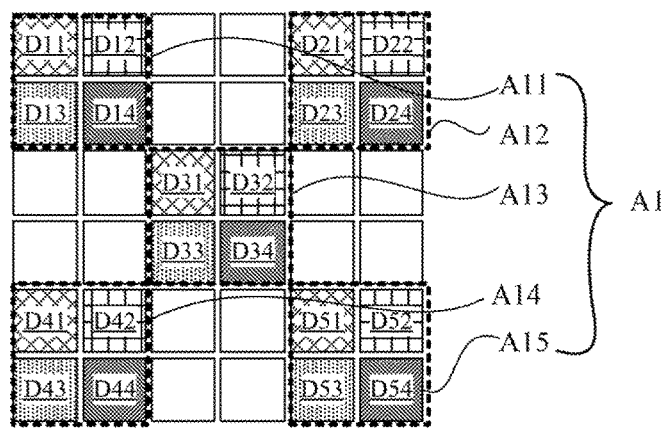
FIG. 6B~6D are the diagrams illustrating the testing steps of the testing unit shown in FIG. 6A according to an embodiment of the present disclosure.
Figure 6C:
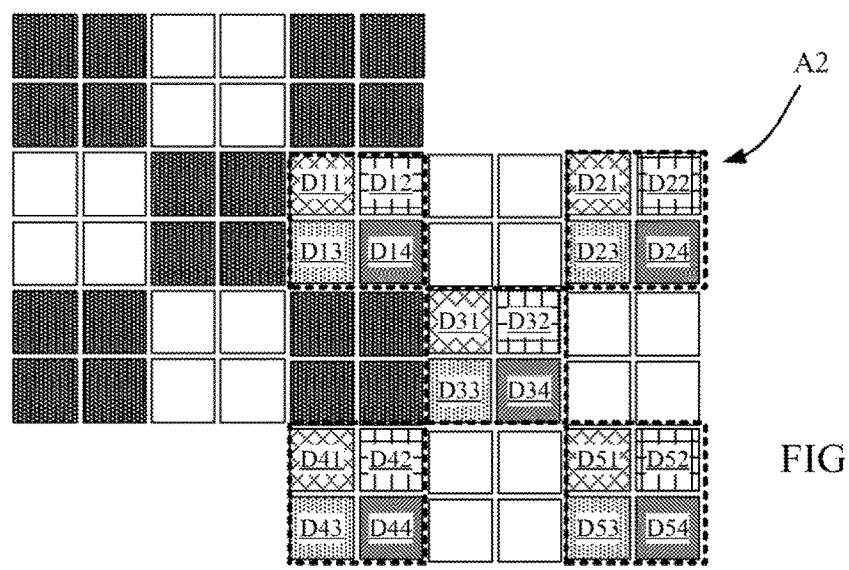

Reference is made in accompany with FIG. 6A~FIG. 6C. FIG. 6A is a diagram illustrating the testing unit 120 according to another embodiment of the present disclosure. FIG. 6B and FIG. 6C are the diagrams illustrating the testing steps of the testing unit 120 shown in FIG. 6A according to an embodiment of the present disclosure. In some embodiments, as illustratively shown in FIG. 6A~FIG. 6C, the testing unit 120 may perform testing along the first direction, then perform testing along the second direction, in order to test the to-be-tested dies in the test region A1.

In the present embodiment, the test region A1 includes 5 rectangular areas A11~A15. Each of the rectangular areas A11~A15 includes 2*2, in the sum 4 to-be-tested dies. For example, the rectangular area A11 includes to-be-tested dies D11~D14, and so on. As illustratively shown in FIG. 6B, the testing unit 120 performs 2 tests respectively along the first direction and the second direction, and tests the to-be-tested dies D11~D51, to-be-tested dies D12~D52, to-be-tested dies D13~D53, to-be-tested dies D14~D54, sequentially so as to complete the test of the dies D11~D54 in the test region A1.

Figure 6D:
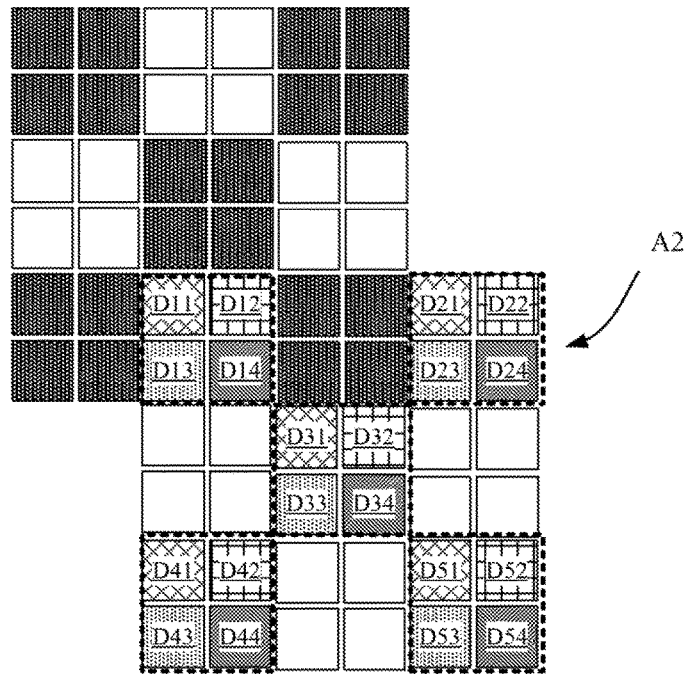

Next, as illustratively shown in FIG. 6C, the testing unit moves along the first direction for m unit and along the second direction for n unit so as to test another test region A2. In the present embodiment, the adjacent first probe sets (e.g., probe sets S1 and S2) arranged in the same row are in the first column and the fifth column respectively, and spaced 4 units from each other. The adjacent first probe sets (e.g., probe sets S1 and S4) arranged in the same column are in the first row and the fifth row respectively, and spaced 4 units from each other. Thus, two alternatives (4, 2) or (2, 4) may be chosen for the moving distance (m, n) of the testing unit 120. In the embodiment shown in FIG. 6B~FIG. 6C, the testing unit 120 moves right for 4 units and down for 2 units in sum when moving from the test region A1 to the test region A2. Similarly, the testing unit 120 may also move right for 2 units and down for 4 units in sum to move from the test region A1 to the test region A2, as illustratively shown in FIG. 6D.

Alternatively stated, in the above various embodiments, the arrangement of the probe sets S1~S5 may be adjusted according to the actual need to coordinate with the circuit routing of the probe card 100. Thus, the probe card 100 may apply probe sets S1~S5 having probes with more complex numbers and arrangement so as to meet the testing requirement of the wafer 200 when maintaining the systematical testing method.

Figure 6E:
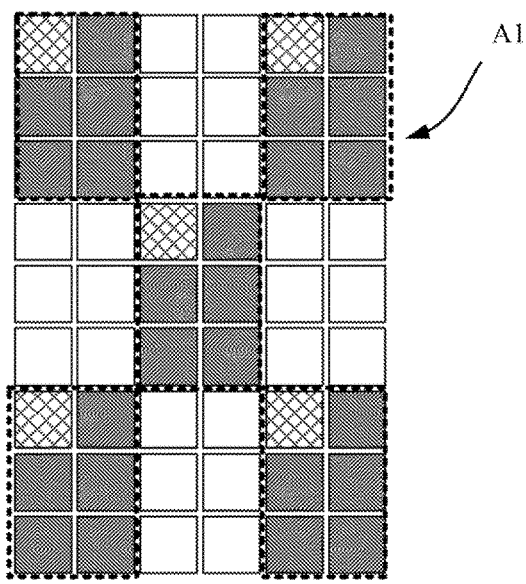
FIG. 6E is a diagram illustrating the testing unit according to another embodiment of the present disclosure.

It is noted that the numbers of the to-be-tested dies included in the test region A1 in the above embodiments may be determined according to the arrangement of the probe sets S1~S5 in the testing unit 120, and thus the present disclosure is not limited thereto. Reference is made to FIG. 6E. FIG. 6E is a diagram illustrating the testing unit 120 according to another embodiment of the present disclosure. For example, in the embodiment shown in FIG. 6E, each of the rectangular areas in the test region A1 includes 2*3 dies to be tested. Alternatively stated, according to the various arrangement of the probe sets S1~S5 in the testing unit 120, each of the five rectangular areas A11~A15 may include a*b to-be-tested dies, in which a and b are any integer.

Reference is made in accompany with FIG. 7A~FIG. 7E. FIG. 7A~FIG. 7E are the diagrams illustrating the testing steps of the testing unit 120 shown in FIG. 2A according to another embodiment of the present disclosure. In the present embodiment, the test region B1 is arranged in a substantially H-shape, which includes to-be-tested dies B11~B15 and B21~B25, and the number of the dies corresponding to the even rows is the number of the dies corresponding to the odd rows minus 2. As illustratively shown in FIG. 7A, the first row of the test region B1 includes to-be-tested dies B11, B21, B12, and B22, 4 dies in sum, and the second row of the test region B1 includes to-be-tested dies B13, and B23, 2 dies in sum, and the third row of the test region B1 includes to-be-tested dies B14, B24, B15, and B25, 4 dies in sum.

Alternatively stated, the test region B1 includes area of the testing unit 120 and the testing unit 120 moving 1 unit along the first direction (e.g., right). Thus, in the present embodiment, as illustratively shown in FIG. 7A and FIG. 7B, the testing unit 120 perform the test along the first direction sequentially when testing the dies B11~B15, and dies B21~B25 in the test region B1 so as to complete the test of all the dies B11~B15, and B21~B25.

Figure 7A:
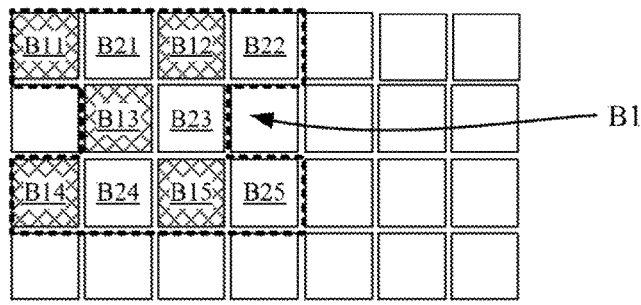
FIG. 7A~7E are the diagrams illustrating the testing steps of the testing unit shown in FIG. 2A according to another embodiment of the present disclosure.
Figure 7B:
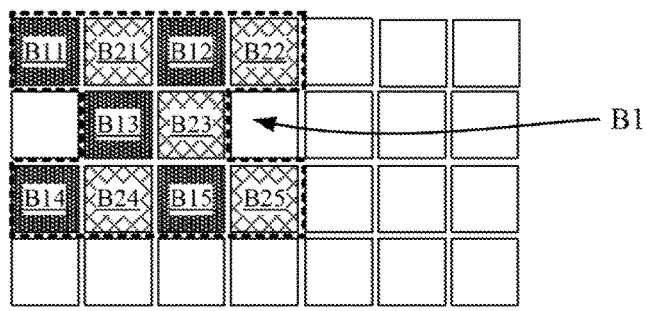
Figure 7C:
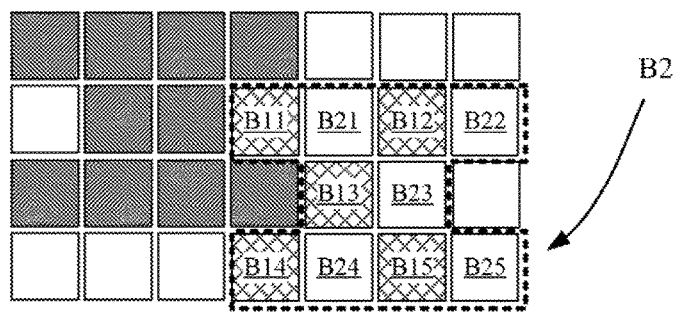
Figure 7D:
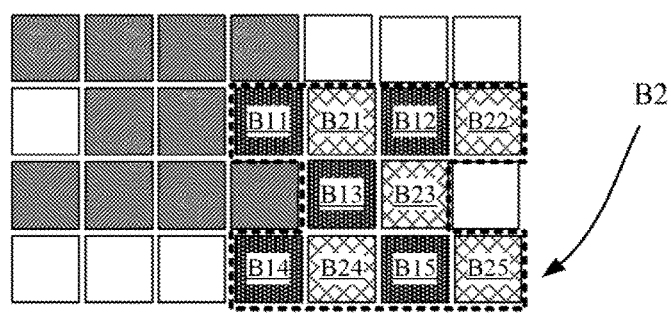
Figure 7E:
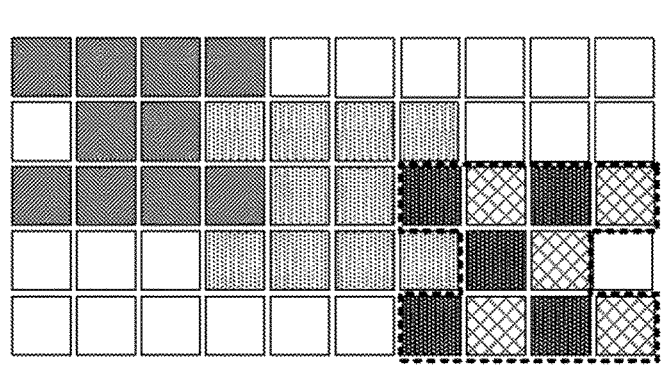

When the test region B1 is tested, next, as illustratively shown in FIG. 7C and FIG. 7D, the testing unit 120 may move m unit along the first direction and n unit along the second direction so as to test another test region B2. By repeating the above operations, the test of the dies in the test region B1~B3 is completed, as illustratively shown in FIG. 7E.

It is noted that, in some embodiments, the H-shaped test region B1 may be applied for testing unit 120 adopting various probe sets arrangement, and is not limited to the testing unit 120 shown in FIG. 2A.

Figure 8A:
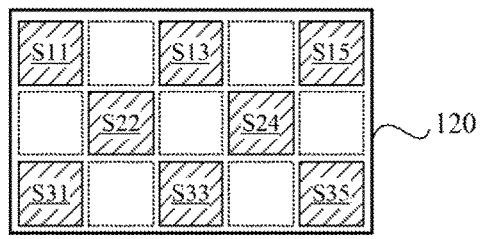
FIG. 8A is a diagram illustrating the testing unit according to an embodiment of the present disclosure.
Figure 8B:
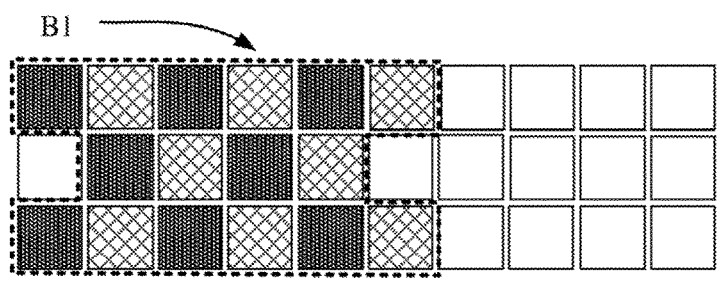
FIG. 8B and FIG. 8C are the diagrams illustrating the testing steps of the testing unit shown in FIG. 8A according to an embodiment of the present disclosure.
Figure 8C:
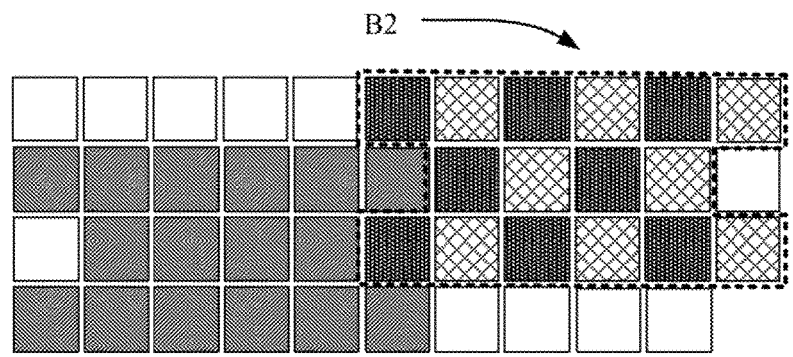

Reference is made in accompany with FIG. 8A~FIG. 8C. FIG. 8A is a diagram illustrating the testing unit 120 according to an embodiment of the present disclosure. FIG. 8B and FIG. 8C are the diagrams illustrating the testing steps of the testing unit 120 shown in FIG. 8A according to an embodiment of the present disclosure.

In the present embodiment, the testing unit 120 includes probe sets S11~S35, in which the probe sets S11, S13, S15 and the probe sets S31, S33, S35 are arranged in the odd rows and odd columns of the testing unit 120, and the probe sets S22 and S24 are arranged in the even rows and even columns of the testing unit 120.

As illustratively shown in FIG. 8B, the test region B1 includes area of the testing unit 120 and the testing unit 120 moving 1 unit along the first direction (e.g., right). Thus, in the present embodiment, the testing unit 120 performs the test along the first direction sequentially when testing the dies in the test region B1 so as to complete the test of all the dies.

When the test region B1 is tested, next, as illustratively shown in FIG. 8C, the testing unit 120 may move m unit along the first direction and n unit along the second direction so as to test another test region B2. By repeating the above operations, the test of all the dies is completed.

Figure 9A:
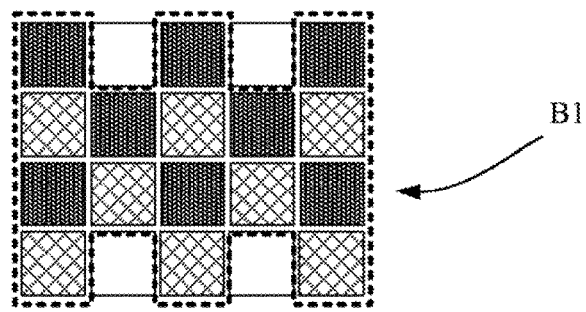
FIG. 9A~FIG. 9C are the diagrams illustrating the testing steps of the testing unit shown in FIG. 8A according to another embodiment of the present disclosure.
Figure 9B:
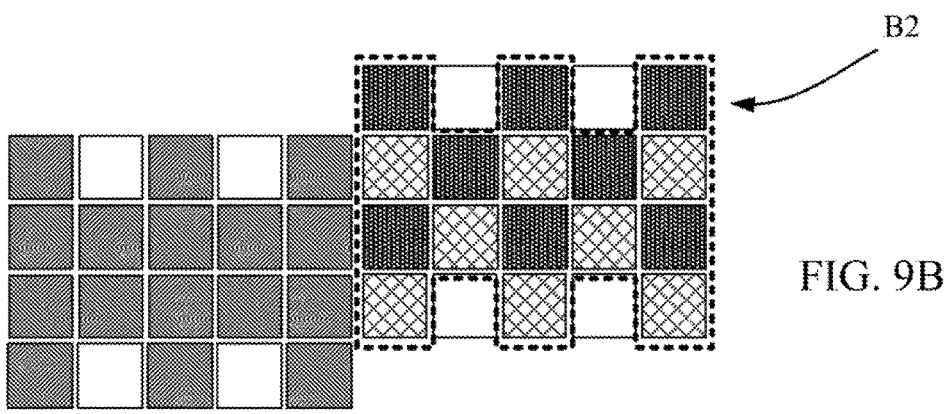
Figure 9C:
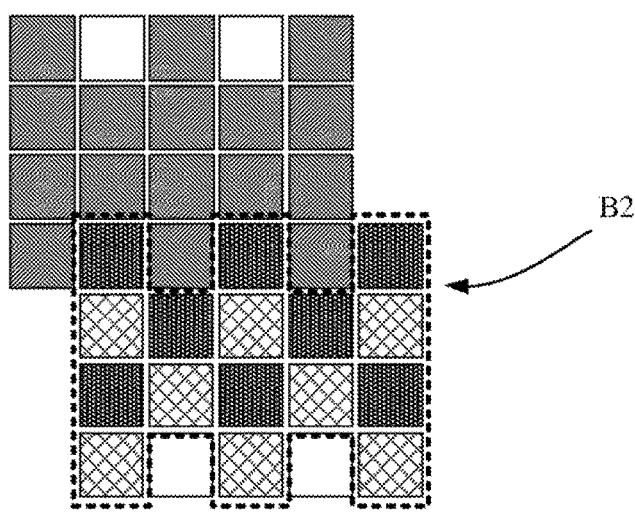

Reference is made in accompany with FIG. 9A~FIG. 9C. FIG. 9A~FIG. 9C are the diagrams illustrating the testing steps of the testing unit 120 shown in FIG. 8A according to another embodiment of the present disclosure.

In some embodiments, as illustratively shown in FIG. 9A, the test region B1 may also include area of the testing unit 120 and the testing unit 120 moving 1 unit along the second direction (e.g., down). Thus, in the present embodiment, the testing unit 120 performs the test along the second direction sequentially when testing the dies in the test region B1 so as to complete the test of all the dies.

When the test region B1 is tested, the testing unit 120 may move m unit along the first direction and n unit along the second direction so as to test another test region B2. By repeating the above operations, the test of all the dies is completed.

It is noted that, as illustratively shown in FIG. 9B and FIG. 9C, the moving direction of the testing unit 120 may be chosen and vary according to actual needs. For example, in the embodiments shown in FIG. 9B, the testing unit 120 moves right for 5 units and up for 1 unit in sum when moving from the test region B1 to the test region B2. In the embodiments shown in FIG. 9C, the testing unit 120 moves right for 1 unit and down for 3 units in sum to move from the test region B1 to the test region B2. Thus, the present disclosure is not limited thereto. In addition, in some embodiments, the testing unit 120 may perform the test sequentially along the first or the second direction to complete the test of the dies in the corresponding test region, but the present disclosure is not limited thereto. For example, the test unit 120 may also randomly perform test along the first or the second direction, which may also complete the test of the dies in the corresponding test region, In summary, in the various embodiments provided in the present disclosure, by arranging the probe sets in a staggered manner, the probe card may perform the test to multiple test regions sequentially along a specific direction. Thus, the probe card may not only synchronously test multiple dies but also perform the test systematically to sequentially test the dies on the wafer. In addition, the probe sets arranged in the staggered manner are vertically and horizontally symmetric, and thus the test may be performed in coordinate with the shape of the boundary of the wafer, which reduces the test times and the cost in need when testing the dies adjacent to the boundary of the wafer.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A probe card, comprising:
a plurality of probe sets arranged as a testing unit, wherein the testing unit is configured to test a plurality of dies in a test region on a wafer, and to move m unit along a first direction and n unit along a second direction when the dies are tested, so as to test a next test region, wherein m and n are integers, wherein the probe sets in the testing unit comprises a plurality of first probe sets and at least one second probe set, and the first probe sets and the at least one second probe set are arranged in a plurality of rows and a plurality of columns in a staggered manner, wherein the at least one second probe is arranged in the rows and columns equidistantly to the adjacent first probe sets.

2. The probe card of claim 1, wherein the testing unit is further configured to perform testing along the first direction to test the dies in the test region.

3. The probe card of claim 2, wherein the testing unit is further configured to perform testing along the second direction to test the dies in the test region.

4. The probe card of claim 1, wherein the adjacent first probe sets arranged in the same row spaced m unit from each other, and the adjacent first probe sets arranged in the same column spaced 2n unit from each other.

5. The probe card of claim 1, wherein the adjacent first probe sets arranged in the same row spaced 2m unit from each other, and the adjacent first probe sets arranged in the same column spaced n unit from each other.

6. The probe card of claim 1, wherein the first probe sets are arranged in the odd rows and the odd columns, and the at least one second probe set is arranged in the even rows and the even columns.

7. The probe card of claim 1, wherein the first probe sets and the at least one second probe set comprises a plurality of probes respectively, and numbers and arrangements of the probes of the first probe sets and the at least one second probe set matches numbers and arrangements of test points of the dies.

8. The probe card of claim 1, wherein the test region includes five rectangular areas arranged in a substantially X-shape.

9. The probe card of claim 8, wherein the length of the rectangular areas is a unit, the width of the rectangular areas is b unit, and each of the rectangular areas comprises a*b dies, wherein a and b are integer.

10. The probe card of claim 1, wherein the test region arranged in a substantially H-shape.

11. The probe card of claim 1, wherein the test region comprises the area of the testing unit and the testing unit moving 1 unit along the first direction.

12. The probe card of claim 1, wherein the test region comprises the area of the testing unit and the testing unit moving 1 unit along the second direction.

13. A testing method, comprising:
testing, by a plurality of probe sets arranged as a testing unit, a plurality of dies in a test region on a wafer, wherein the probe sets in the testing unit comprises a plurality of first probe sets and at least one second probe set, and the first probe sets and the at least one second probe set are arranged in a plurality of rows and a plurality of columns in a staggered manner, wherein the at least one second probe is arranged in the rows and columns equidistantly to the adjacent first probe sets; and
moving the testing unit for m unit along a first direction and n unit along a second direction when the dies in the test region are tested, so as to test a next test region, wherein m and n are integers.

14. The testing method of claim 13, further comprising:
testing, by the testing unit, along the first direction to test the dies in the test region.

15. The testing method of claim 14, further comprising:
testing, by the testing unit, along the second direction to test the dies in the test region.

16. The testing method of claim 13, wherein the test region comprises five rectangular areas arranged in a substantially X-shape.

17. The testing method of claim 16, wherein the length of the rectangular areas is a unit, the width of the rectangular areas is b unit, and each of the rectangular areas comprises a*b dies, wherein a and b are integer.

18. The testing method of claim 13, wherein the test region arranged in a substantially H-shape.

19. The testing method of claim 13, wherein the number of the dies corresponding to the even columns of the test region is the number of the dies corresponding to the odd columns of the test region minus 2.

* * * * *